(12) United States Patent
Anderson et al.

(10) Patent No.: US 8,039,908 B2
(45) Date of Patent: Oct. 18, 2011

(54) DAMASCENE GATE HAVING PROTECTED SHORTING REGIONS

(75) Inventors: Brent A. Anderson, Jericho, VT (US); Edward J. Nowak, Essex Junction, VT (US); Jed H. Rankin, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 52 days.

(21) Appl. No.: 12/616,389

(22) Filed: Nov. 11, 2009

(65) Prior Publication Data

US 2011/0108927 A1    May 12, 2011

(51) Int. Cl.
*H01L 21/00* (2006.01)
(52) U.S. Cl. .................. 257/412; 257/413; 438/592
(58) Field of Classification Search .......... 257/412–413; 438/585–595
See application file for complete search history.

(56) References Cited

U.S. PATENT DOCUMENTS

| | | | |
|---|---|---|---|
| 5,965,462 A | 10/1999 | Tan et al. | |
| 6,054,355 A * | 4/2000 | Inumiya et al. | 438/296 |
| 6,174,762 B1 | 1/2001 | Bronner et al. | |
| 6,337,278 B1 | 1/2002 | Butler | |
| 6,498,096 B2 | 12/2002 | Bruce et al. | |
| 6,858,483 B2 | 2/2005 | Doczy et al. | |
| 7,026,689 B2 | 4/2006 | Liaw | |
| 7,316,949 B2 | 1/2008 | Doczy et al. | |
| 2006/0024940 A1 | 2/2006 | Furukawa et al. | |

* cited by examiner

*Primary Examiner* — Richard A. Booth
(74) *Attorney, Agent, or Firm* — Hoffman Warnick LLC; Richard Kotulak

(57) ABSTRACT

The present invention relates generally to semiconductor devices and, more specifically, to damascene gates having protected shorting regions and related methods for their manufacture. A first aspect of the invention provides a method of forming a damascene gate with protected shorting regions, the method comprising: forming a damascene gate having: a gate dielectric atop a substrate; a gate conductor atop the gate dielectric; a conductive liner laterally adjacent the gate conductor; a spacer between the conductive liner and the substrate; and a first dielectric atop the gate conductor; removing a portion of the conductive liner; and depositing a second dielectric atop a remaining portion of the conductive liner, such that the second dielectric is laterally adjacent both the first dielectric and the gate.

10 Claims, 4 Drawing Sheets

DAMASCENE GATE HAVING PROTECTED SHORTING REGIONS

BACKGROUND OF THE INVENTION

Embodiments of the present invention relates generally to semiconductor devices and, more specifically, to damascene gates having protected shorting regions and related methods for their manufacture.

Current integrated circuit (IC) designs often employ contact sizes, gate sizes, and operating voltages that risk unintentional contact etching and/or contact-to-gate electrical shorts. Gate corners are particularly susceptible to such contact-to-gate shorts. One solution to this problem is increasing the space between contacts and gate corners. Such solutions are unsatisfactory, however, due to the increase in gate size necessitated by such increased space and the attendant impairment of device performance.

SUMMARY OF THE INVENTION

The invention provides damascene gates with protected shorting regions, as well as methods for their manufacture.

A first aspect of the invention provides a method of forming a damascene gate with protected shorting regions, the method comprising: forming a damascene gate having: a gate dielectric atop a substrate; a gate conductor atop the gate dielectric; a conductive liner laterally adjacent the gate conductor; a spacer between the conductive liner and the substrate; and a first dielectric atop the gate conductor; removing a portion of the conductive liner; and depositing a second dielectric atop a remaining portion of the conductive liner, such that the second dielectric is laterally adjacent both the first dielectric and the gate.

A second aspect of the invention provides a method of forming a damascene gate with protected shorting regions, the method comprising: forming a damascene gate having: a gate dielectric atop a substrate; a gate conductor atop the gate dielectric; a conductive liner laterally adjacent the gate conductor; a spacer between the conductive liner and the substrate; and a first dielectric atop the gate conductor; and depositing a second dielectric atop a portion of the substrate, the gate dielectric, the conductive liner, and the spacer, wherein the second dielectric forms a protected shorting region above at least one upper corner of the gate conductor.

A third aspect of the invention provides a damascene gate comprising: a gate dielectric atop a substrate; a gate conductor atop the gate dielectric; a conductive liner laterally adjacent the gate conductor; a spacer between the conductive liner and the substrate; a first dielectric atop the gate conductor; and a second dielectric atop the conductive liner and laterally adjacent both the first dielectric and the spacer.

A fourth aspect of the invention provides a damascene gate comprising: a gate dielectric atop a substrate; a gate conductor atop the gate dielectric; a conductive liner laterally adjacent the gate conductor; a first dielectric atop at least a portion of the gate conductor; a spacer between the conductive liner and the substrate; and a second dielectric atop a portion of the substrate, the spacer, the conductive liner, and the first dielectric, wherein the second dielectric forms a protected shorting region above at least one upper corner of the gate conductor.

The illustrative aspects of the present invention are designed to solve the problems herein described and other problems not discussed, which are discoverable by a skilled artisan.

BRIEF DESCRIPTION OF THE SEVERAL VIEWS OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1A:
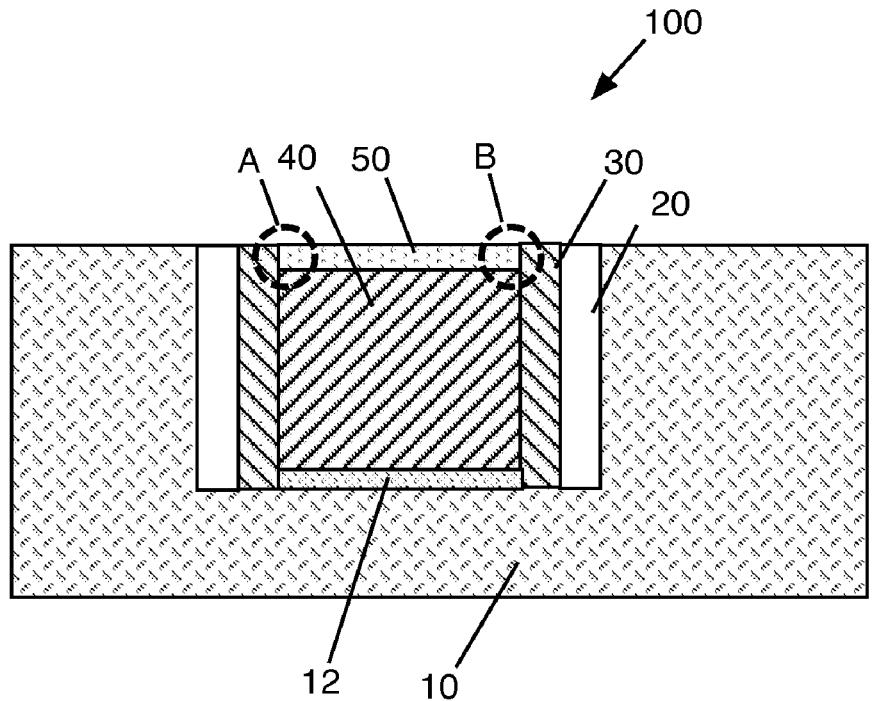
FIGS. 1A-C show cross-sectional side views of a method of forming a damascene gate with protected shorting regions according to one embodiment of the invention.

Referring now to FIG. 1A, a damascene gate 100 is shown, the gate comprising a substrate 10, a gate dielectric 12, a spacer 20, a conductive liner 30, a gate conductor 40, and a first dielectric 50. Areas A and B show the upper corner regions of gate conductor 40 which, as noted above, are areas of the gate 100 particularly susceptible to contact-to-gate electrical shorts.

The materials of each gate element may be those typically employed. Materials other than those enumerated below will be known to one skilled in the art and are within the scope of the present invention. For example, substrate 10 may include silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). In some embodiments, the substrate 10 may include amorphous or polycrystalline silicon.

Gate dielectric 12 may include, for example, oxide, silicon oxide, silicon dioxide, silicon oxynitride, silicon nitride $(Si_3N_4)$, tantalum oxides, alumina, hafnium oxide $(HfO_2)$, hafnium silicate (HfSi), plasma-enhanced chemical vapor deposition oxide, tetraethylorthosilicate, nitrogen oxides, nitrided oxides, aluminum oxides, zirconium odixe $(ZrO_2)$, zirconium silicate $(ZrSiO_x)$, high K (K>5) materials, and/or combinations thereof.

Conductive liner 30 may include, for example, hard metals, such as tungsten, molybdenum, osmium, iridium, or alloys thereof.

Gate conductor 40 may include, for example, aluminum, an aluminum-copper alloy, cobalt, cobalt silicide, copper, metal silicide, nickel, nickel silicide, a nitrided metal, palladium, platinum, a refractory metal, such as ruthenium, tantalum nitride, titanium, titanium aluminum nitride, titanium nitride, titanium silicide, a titanium-tungsten alloy, and/or tungston carbon nitride, and/or combinations thereof.

First dielectric 50 may include, for example, oxide, silicon oxynitride, silicon nitride, low-pressure tetraethylorthosilicate, high-temperature oxide, furnace oxide, plasma-enhanced chemical-enhanced deposition oxide, low-pressure oxide, hafnium oxides, tantalum oxides, aluminum oxides, oxygen dielectrics, nitrogen dielectrics, and/or combinations thereof.

Figure 1B:
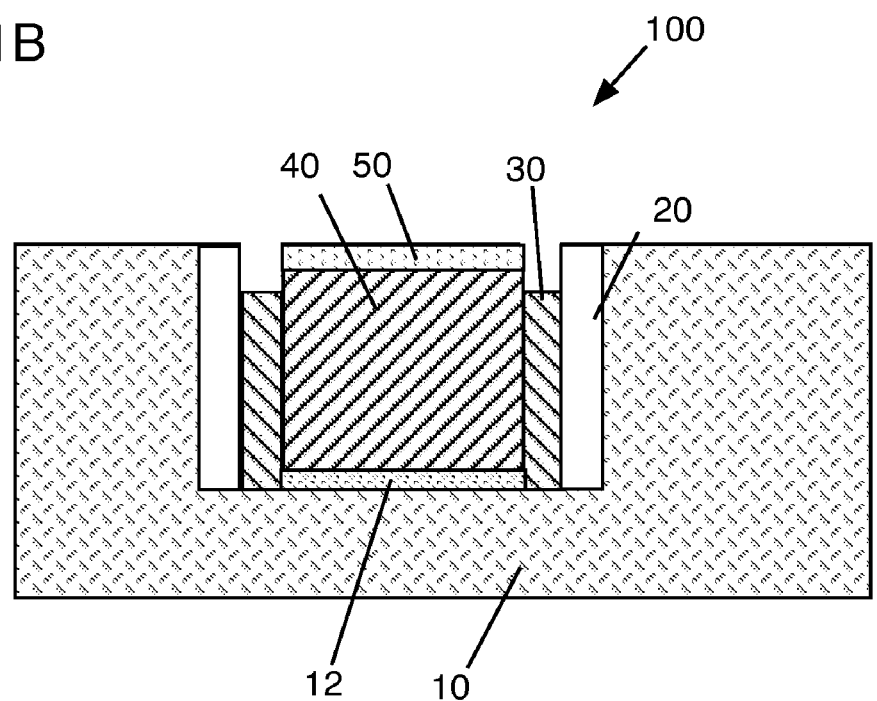

In FIG. 1B, gate 100 has been selectively masked (not shown) and etched to remove an upper portion of conductive liner 30.

Figure 1C:
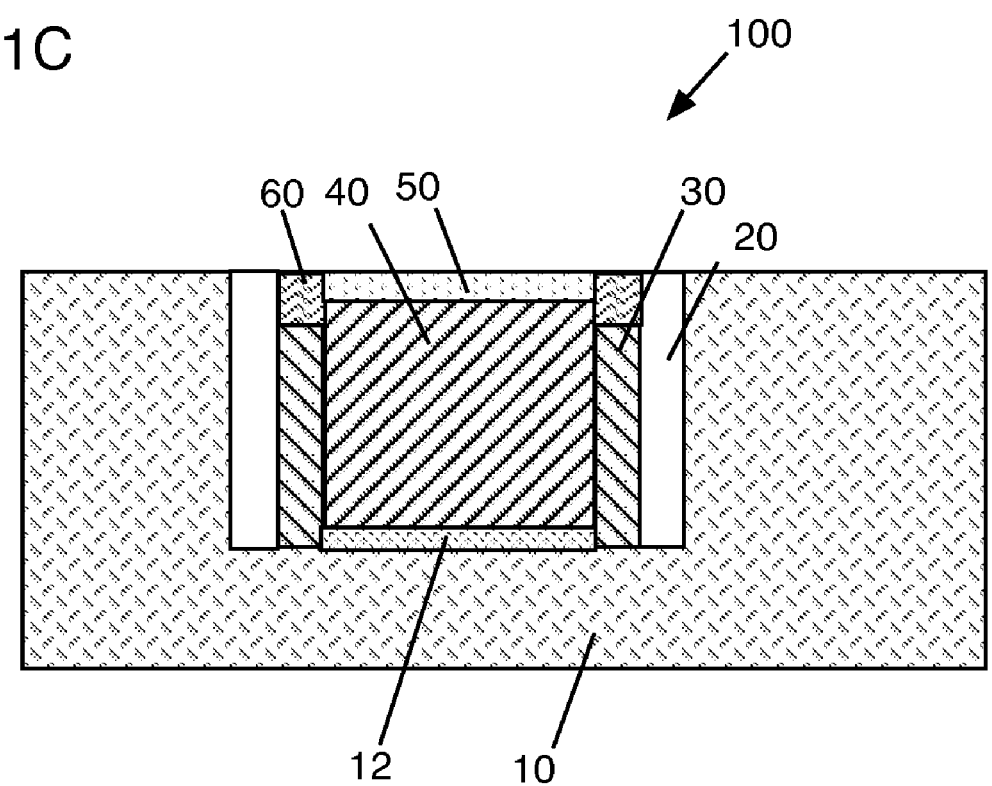

In FIG. 1C, a second dielectric 60 is deposited atop the remaining portion of conductive liner 30 such that second dielectric 60 is between and laterally adjacent both spacer 20 and first dielectric 50. In some embodiments, including the one shown in FIG. 1C, second dielectric 60 is also laterally adjacent a portion of gate conductor 40.

Second dielectric 60 may include, for example, oxide, silicon oxynitride, silicon nitride, low-pressure tetraethylorthosilicate, high-temperature oxide, furnace oxide, plasma-enhanced chemical-enhanced deposition oxide, low-pressure oxide, hafnium oxides, tantalum oxides, aluminum oxides, oxygen dielectrics, nitrogen dielectrics, high dielectric constant (high K (e.g., K>5)) material, and/or combinations thereof.

In some embodiments of the invention, the material(s) of the second dielectric 60 differ(s) from the material(s) of first dielectric 50. As used herein, "differ," "different," and "differs" are meant to include different proportions of materials as well as different materials themselves.

Second dielectric 60 may be deposited by any number of techniques, the choice of which may vary, of course, based on the material(s) employed. Suitable deposition techniques include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, or evaporation.

Gate 100 of FIG. 1C may be further processed, including, for example, polishing, such as by chemical mechanical polishing (CMP).

Figure 2A:
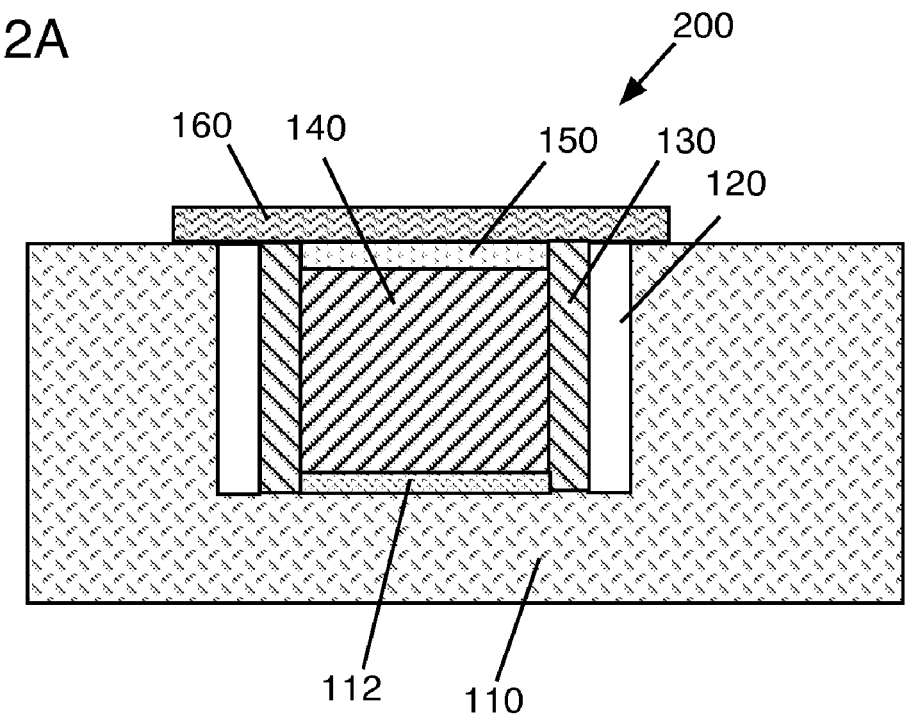
FIGS. 2A-B show cross-sectional side views of a method of forming damascene gates with protected shorting regions according to alternative embodiments of the invention.
Figure 2B:
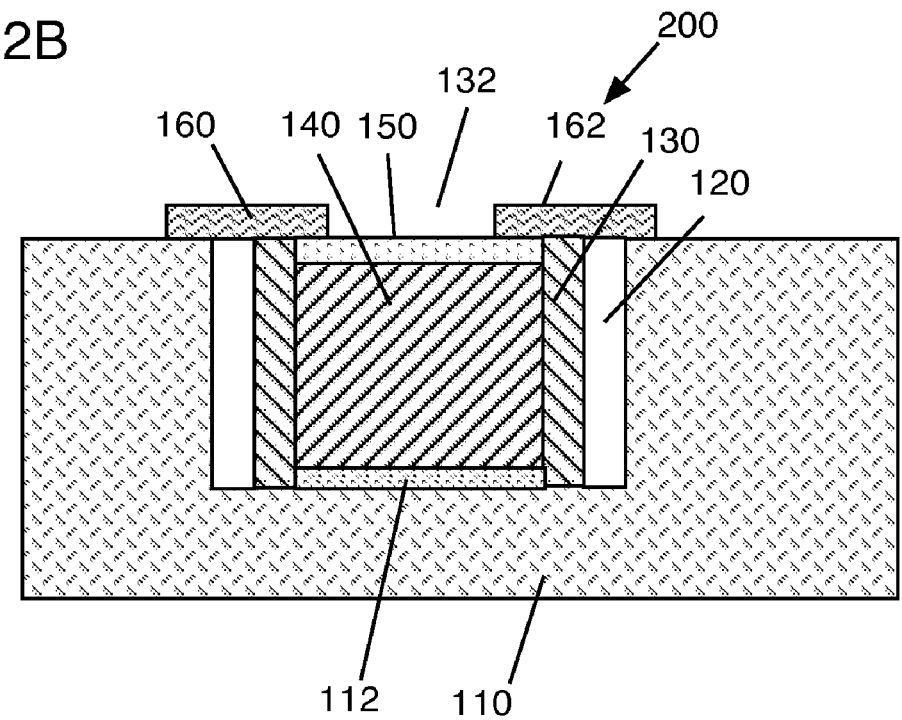

FIGS. 2A-B show alternative embodiments of the invention. In FIG. 2A, an etch-resistant second dielectric 160 is deposited and etched such that it lies atop first dielectric 150, conductive liner 130, spacer 120, and a portion of substrate 110. In the embodiment shown in FIG. 2A, the upper corners of gate conductor 140 are again protected from contact-to-gate electrical shorts by second dielectric 160.

FIG. 2B shows yet another embodiment of a gate 200 according to the invention. Here, second dielectric 160 of FIG. 2A has been etched to expose the gate for easy contacting while leaving the upper corners of gate conductor 140 covered by two portions of second dielectric 160, 162.

The material(s) included in second dielectric 160, 162 may be as described above. In some embodiments of the invention, the material(s) of second dielectric 160, 162 is (are) different than the material(s) of first dielectric 150.

Figure 3:
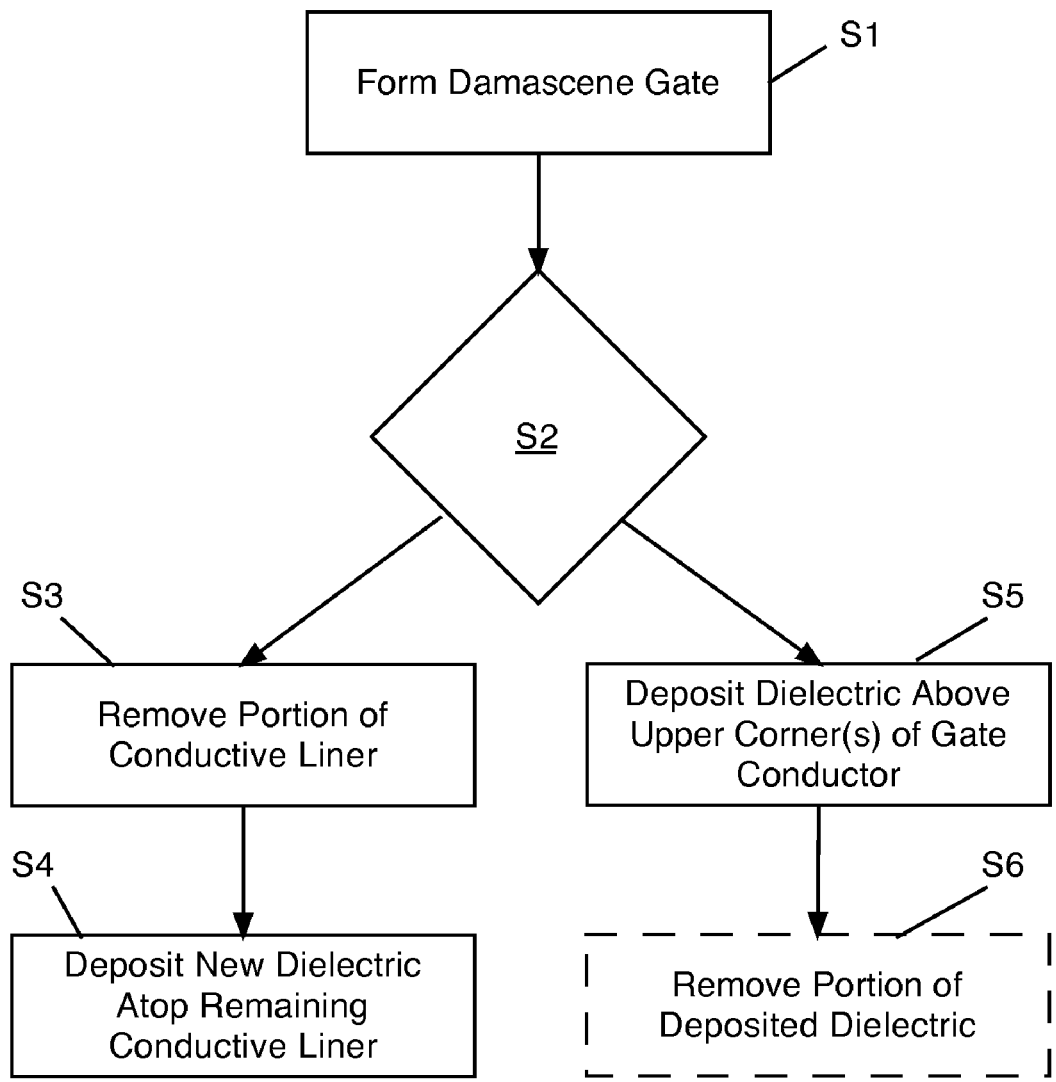
FIG. 3 shows a flow diagram of illustrative methods according to various embodiments of the invention.

FIG. 3 shows a flow diagram depicting illustrative methods according to various embodiment of the invention. At 51, a damascene gate is formed, the damascene gate including a gate conductor (40, FIG. 1A) within a substrate (10, FIG. 1A), a conductive liner (30, FIG. 1A) laterally adjacent the gate conductor, a spacer (20, FIG. 1A) between the conductive liner and the substrate, and a dielectric (50, FIG. 1A) atop the gate conductor. Methods and techniques for formation of such a damascene gate are conventional and would be known to one skilled in the art. For purposes of brevity, therefore, they shall not be further described herein.

At S2, the flow can follow one of two paths, depending on the gate-forming method desired. Taking the first path, at S3, a portion of the conductive liner 30 is removed and, at S4, a new dielectric (60, FIG. 1C) is deposited atop the remaining portion of the conductive liner 30. Thus, the first path results in a damascene gate such as that shown in FIG. 1C.

Taking the second path, at S5, a dielectric (160, FIG. 2A) is deposited above one or more upper corners of the gate conductor (e.g., the dielectric is deposited atop the first dielectric (150, FIG. 2A), conductive liner (130, FIG. 2A), spacer (120, FIG. 2A), and a portion of the substrate (110, FIG. 2A)). Thus, the first path, up to S5, results in a damascene gate such as that shown in FIG. 2A. Continuing the second path, a portion of the deposited dielectric may optionally be removed at S6, resulting in a damascene gate such as that shown in FIG. 2B.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A damascene gate comprising:
   a gate dielectric atop a substrate;
   a gate conductor directly atop the gate dielectric;
   a conductive liner laterally adjacent the gate conductor;
   a spacer between the conductive liner and the substrate;
   a first dielectric atop the gate conductor; and
   a second dielectric atop the conductive liner, between and laterally adjacent both the first dielectric and the spacer.

2. The damascene gate of claim 1, wherein the second dielectric is adjacent an upper corner of the damascene gate.

3. The damascene gate of claim 1, wherein each of the first dielectric and the second dielectric includes at least one material selected from a group consisting of: oxide, silicon oxynitride, silicon nitride, low-pressure tetraethylorthosilicate, high-temperature oxide, furnace oxide, plasma-enhanced chemical-enhanced deposition oxide, low-pressure oxide, hafnium oxides, tantalum oxides, aluminum oxides, oxygen dielectrics, nitrogen dielectrics, high dielectric constant (high K) materials, and combinations thereof.

4. The damascene gate of claim 3, wherein the second dielectric includes a high K material.

5. The damascene gate of claim 3, wherein the second dielectric includes a material different than the first dielectric.

6. A damascene gate comprising:
   a gate dielectric atop a substrate;
   a gate conductor directly atop the gate dielectric;
   a conductive liner laterally adjacent the gate conductor;
   a first dielectric atop at least a portion of the gate conductor;
   a spacer between the conductive liner and the substrate; and
   a second dielectric directly atop a portion of the substrate, the spacer, the conductive liner, and the first dielectric, wherein the second dielectric forms a protected shorting region above at least one upper corner of the gate conductor.

7. The damascene gate of claim 6, wherein the second dielectric is positioned adjacent an upper corner of the gate conductor.

8. The damascene gate of claim 6, wherein each of the first dielectric and the second dielectric includes at least one material selected from a group consisting of: oxide, silicon oxynitride, silicon nitride, low-pressure tetraethylorthosilicate, high-temperature oxide, furnace oxide, plasma-enhanced chemical-enhanced deposition oxide, low-pressure oxide, hafnium oxides, tantalum oxides, aluminum oxides, oxygen dielectrics, nitrogen dielectrics, high dielectric constant (high K) materials, and combinations thereof.

9. The damascene gate of claim 8, wherein the second dielectric includes a high K material.

10. The damascene gate of claim 8, wherein the first dielectric includes a material different than the second dielectric.

* * * * *